US006567093B1

(12) United States Patent
Tai et al.

(10) Patent No.: US 6,567,093 B1
(45) Date of Patent: May 20, 2003

(54) SINGLE SEMICONDUCTOR CHIP FOR ADAPTING VIDEO SIGNALS TO DISPLAY APPARATUS

(75) Inventors: Chiao-Yen Tai, Hsiangshan (TW); Jeff Hsin, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 09/392,217

(22) Filed: Sep. 9, 1999

(51) Int. Cl.[7] ....................... G06F 13/14; H03L 31/113; G11C 7/02

(52) U.S. Cl. ....................... 345/519; 345/547; 345/530; 345/718; 257/347; 257/291; 365/189.07; 365/208

(58) Field of Search ................................ 345/718–720, 345/547–548, 181, 519, 213, 546, 530, 501, 418, 538, 714, 204, 3.1, 11, 24; 348/184, 191, 776, 791, 704; 365/189.01, 189.04, 189.08, 208, 189.07; 257/240, 258, 334, 337, 499, 443, 347, 291, 72, 59

(56) References Cited

U.S. PATENT DOCUMENTS

| | | | | | |
|---|---|---|---|---|---|
| 5,150,109 | A | | 9/1992 | Berry | |
| 5,404,153 | A | | 4/1995 | Kim | |
| 5,696,527 | A | * | 12/1997 | King et al. | 345/634 |
| 5,727,191 | A | | 3/1998 | Konishi et al. | |
| 5,883,613 | A | | 3/1999 | Iwaki | |
| 5,910,806 | A | | 6/1999 | Narui et al. | |
| 5,917,770 | A | * | 6/1999 | Tanaka | 365/230.03 |
| 6,292,201 | B1 | * | 9/2001 | Chen et al. | 345/519 |
| 6,295,053 | B1 | * | 9/2001 | Tsai et al. | 345/204 |

* cited by examiner

*Primary Examiner*—Matthew C. Bella
*Assistant Examiner*—Wesner Sajous
(74) *Attorney, Agent, or Firm*—Thomas, Kayden, Horstemeyer & Risley

(57) ABSTRACT

A single semiconductor chip is configured to better perform the functions which are conventionally provided by 3 semiconductor chips in a monitor for adapting video signals to the specification of the monitor for adequate displaying. Its configuration is characterized by storing main program, DDC data, and DFF data together in a storage circuit such as a REPROM, and by a novel arrangement of connection between its storage circuit and operating circuit.

20 Claims, 4 Drawing Sheets

SINGLE SEMICONDUCTOR CHIP FOR ADAPTING VIDEO SIGNALS TO DISPLAY APPARATUS

FIELD OF THE INVENTION

The present invention generally relates to a semiconductor chip communicating with a video signal forwarder or provider for enabling a video display apparatus to display video signals, and particularly to a semiconductor chip communicating with a VGA card for enabling a video display apparatus to display the video signals outputted from the VGA card.

BACKGROUND OF THE INVENTION

As represented by FIG. 1, a CRT monitor 1 conventionally requires a system to communicate with a VGA card 2 through a bus 3 and a bus 4 in order to perform normal video displaying. The system usually comprises a chip 11 composed of a EEPROM storing DFF data; a chip 13 composed of a first-group-of-data-interface-unit 132 which communicates with VGA card 2 through a bus 4, and an EEPROM 131 storing DDC data accessible by first-group-of-data-interface-unit 132; and a chip 12 which is a MCU (micro control unit) composed of a CPU 121, a ROM 122 storing a program executable by CPU 121, and a logic block 123 communicating with VGA card 2 through bus 3 and directed by CPU 121 to output a signal for enabling the CRT of CRT monitor 1 to display video signals.

Such a conventional system as shown in FIG. 1 requires 3 semiconductor chips 11, 12, and 13, resulting in need of complicate interfacing and relatively sophisticated design, and leading to higher likelihood of facing difficulties and problems when proceeding mass production. Another disadvantage of such a conventional system is that its size can not be easily reduced to cope with the trend of minimizing the size of a display system, especially a portable system.

SUMMARY OF THE INVENTION

It is therefore an object of the present invention to configure a system on a single semiconductor chip so that the 3 semiconductor chips which conventionally serve as essential elements for a monitor can be substituted by a system built in a single semiconductor chip, thereby lower cost, easier design, simpler mass production, relatively high operating speed, as well as less manufacturing failure rate can be realized.

It must be noted that the semiconductor chip suggested by the present invention is not limited to the application in the field of CRT monitor. Actually it can be applied to any type of display system.

The configuration of a system-on-chip according to the present invention is characterized by storing main program, DDC (display data channel) data, and DFF (display frame frequency) data together in a storage circuit such as a REPROM, and by a novel arrangement of connection between its storage circuit and its operating circuits such as a CPU, an interface unit, or a logic block.

A first aspect of the present invention may be represented by a semiconductor chip which communicates with a video signal provider for enabling a video display apparatus to display a video signal provided by the video signal provider, and which comprises:

storage means for storing a program (computer program, or a group of executable commands, for example), a first group of data such as DDC (display data channel) data, and a second group of data such as DFF (display frame frequency) data; and operating means, for responding to a data request signal received from the video signal provider, to read the first group of data and send the read first group of data to the video signal provider, and for responding to a data-match signal received from the video signal provider to detect a data mode of the data-match signal and to read, according to the detected data mode, a corresponding part of second group of data from among the second group of data, and for adapting, according to the program, the corresponding part of second group of data for being received by the video display apparatus to enable the video display apparatus to display the video signal provided by the video signal provider or its associated device.

The adapting of the corresponding part of second group of data by the operating means according to the program may mean that the program is accessed and executed by the operating means and the operating means is directed thereafter by the program execution to adapt the corresponding part of second group of data for being received by the video display apparatus to enable the video display apparatus to display the video signal provided by the video signal provider or its associated device, i.e., the corresponding part of second group of data is so adapted, according to the program, as to be in a level or a type receivable by the video display apparatus and capable of enabling the video display apparatus to display the video signal provided by the video signal provider or its associated device.

The video signal (such as RGB components) provided by the video signal provider or its associated device is not necessarily inputted to the semiconductor chip, it can be applied directly to the video display apparatus and is displayed as a result that the video display apparatus had been properly enabled by the adapted corresponding part of second group of data supplied by the semiconductor chip.

According to the first aspect of the present invention, the video signal provider may be a computer, a video recorder output device, or any apparatus having video data to be outputted for displaying, and the semiconductor chip may be installed in a monitor and connected to a display control circuit of the video display apparatus in the monitor through a signal channel. Conventionally the display control circuit controls the displaying of video display apparatus according to the signals outputted from the system composed of 3 semiconductor chips shown in FIG. 1. Similarly, according to the present invention, the display control circuit controls the displaying of video display apparatus according to the adapted corresponding part of second group of data outputted from the operating means of the single semiconductor chip provided by the present invention. The storage means may be any type of memory capable of storing data accessible by the operating means. The data request signal is sent to the operating means for requesting the operating means to read the first group of data and send the read first group of data to the video signal provider, thereby the specification of the monitor expected to display the video signal provided by the video signal provider (or its associated system) can be recognized by the video signal provider, whereby the video signal can be provided in a mode corresponding to the specification of the monitor. The corresponding part of second group of data above is the data which is a part of the second group of data and which corresponds to the data mode of the data-match signal, wherein the data-match signal may be a synchronous signal such as a vertical synchronous signal or a horizontal synchronous signal or the combination of the both. The corresponding part of second group of data is not always receivable by the video display apparatus or capable of enabling the video display apparatus to display the video signal provided by the video signal provider, therefore it usually has to be adapted according to a program.

According to the first aspect of the present invention, the semiconductor chip may further comprise a communication channel between the operating means and the storage means for the operating means to read the first group of data, the second group of data, and to access the program. Specifically the operating means according to the present invention may comprise a first-group-of-data-interface-unit for receiving the data request signal and sending the read first group of data to the video signal provider, and the single chip according to the present invention may also comprise a DDC-communication-channel particularly for the first-group-of-data-interface-unit to access the first group of data therethrough.

According to the first aspect of the present invention, the storage means may comprise two storage parts, either physically connected or completely independent of each other, with the first storage part storing the first group of data accessible by the first-group-of-data-interface-unit through the DDC-communication-channel, and the second storage part storing the program and the second group of data both accessible by the operating means through the communication channel.

A second aspect of the present invention may be represented by a semiconductor chip which communicates with a video signal forwarder for enabling a video display apparatus to display a video signal outputted from the video signal forwarder (or its associated apparatus), and which comprises:

operating means; and storage means for storing a program (computer program, or a group of executable commands, for example), a first group of data, and a second group of data, all accessible by the operating means;

the operating means responsive to a data request signal applied thereto (may be outputted by the video signal forwarder or any device affiliated therewith or controlled by it) for forwarding the first group of data from the storage means to the video signal provider, and responsive to a data-match signal received from the video signal forwarder for detecting a data mode of the data-match signal to read, according to the detected data mode, a corresponding part of second group of data from among the second group of data, and directed by the program to adapt the corresponding part of second group of data for being received by the video display apparatus to enable the video display apparatus to display the video signal outputted from the video signal forwarder or any system associated with or controlled by the video signal forwarder.

The video signal forwarder may be a computer system, an internet interface, or any apparatus capable of receiving, buffering, or adapting signals for outputting to a display apparatus for displaying.

A third aspect of the present invention may be represented by a semiconductor chip comprising the following elements for communicating with a video signal forwarder for enabling a video display apparatus to display a video signal outputted from the video signal forwarder, a first-group-of-data-interface-unit;

a logic processing unit;

first storage means for storing a first group of data accessible by the first-group-of-data-interface-unit;

second storage means for storing a program and a second group of data all accessible by the logic processing means;

the first-group-of-data-interface-unit responsive to a data request signal applied thereto (may be outputted by the video signal forwarder, or any device controlled by the video signal forwarder, or any system affiliated with the video signal forwarder) for reading the first group of data and sending the read first group of data to the video signal forwarder, the logic processing unit responsive to a data-match signal received from the video signal forwarder for detecting a data mode of the data-match signal to read, according to the detected data mode, a corresponding part of second group of data from among the second group of data, and directed by the program to adapt the corresponding part of second group of data for being received by the video display apparatus to enable the video display apparatus to display the video signal outputted from the video signal forwarder.

The present invention may best be understood through the following description with reference to the accompanying drawings, in which:

DETAILED DESCRIPTION OF THE PREFERRED EMBODIMENTS

Figure 1:
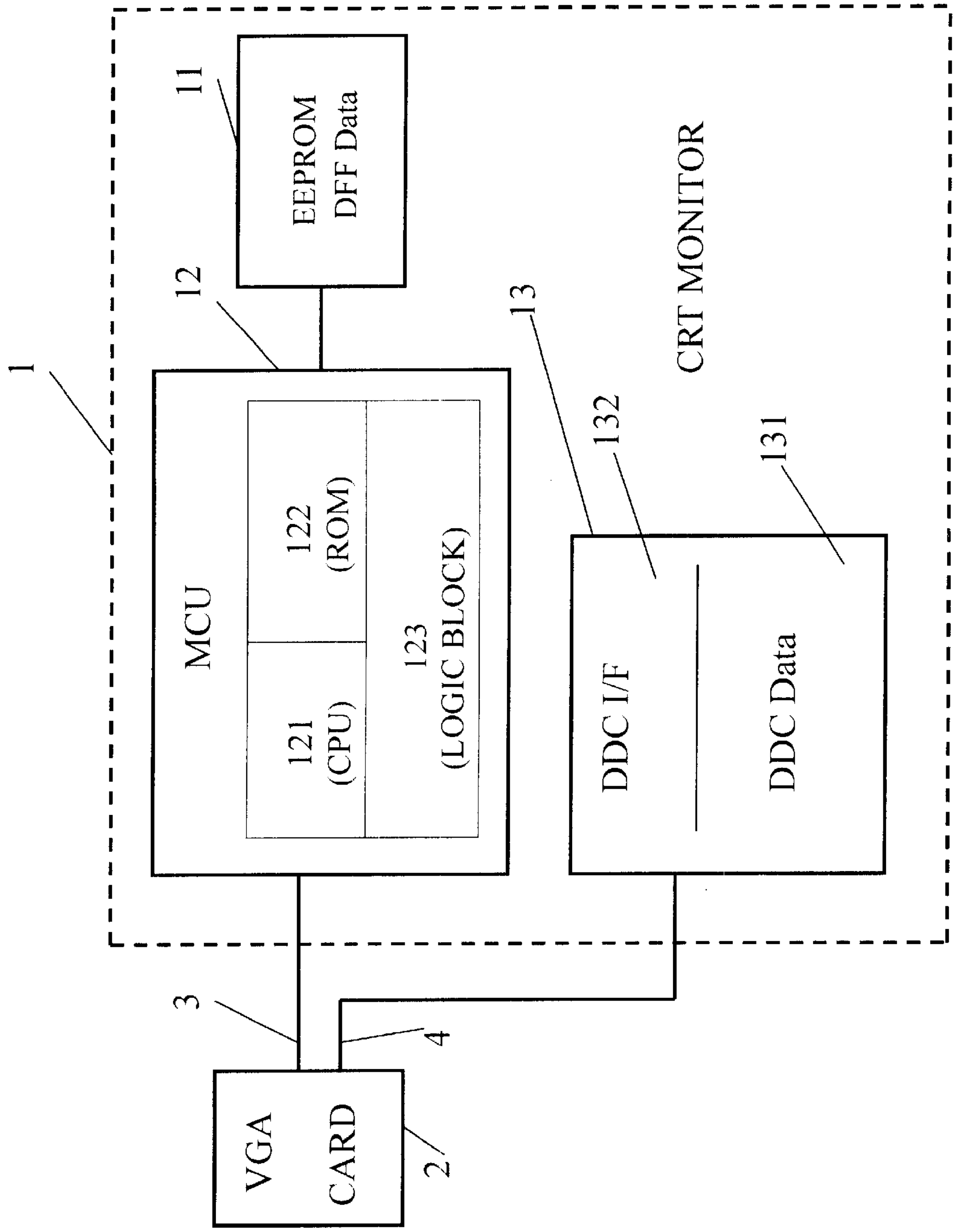
Fig. 1 (Prior art)
FIG. 1 is a diagram showing 3 semiconductor chips conventionally used in a monitor.
Figure 2:
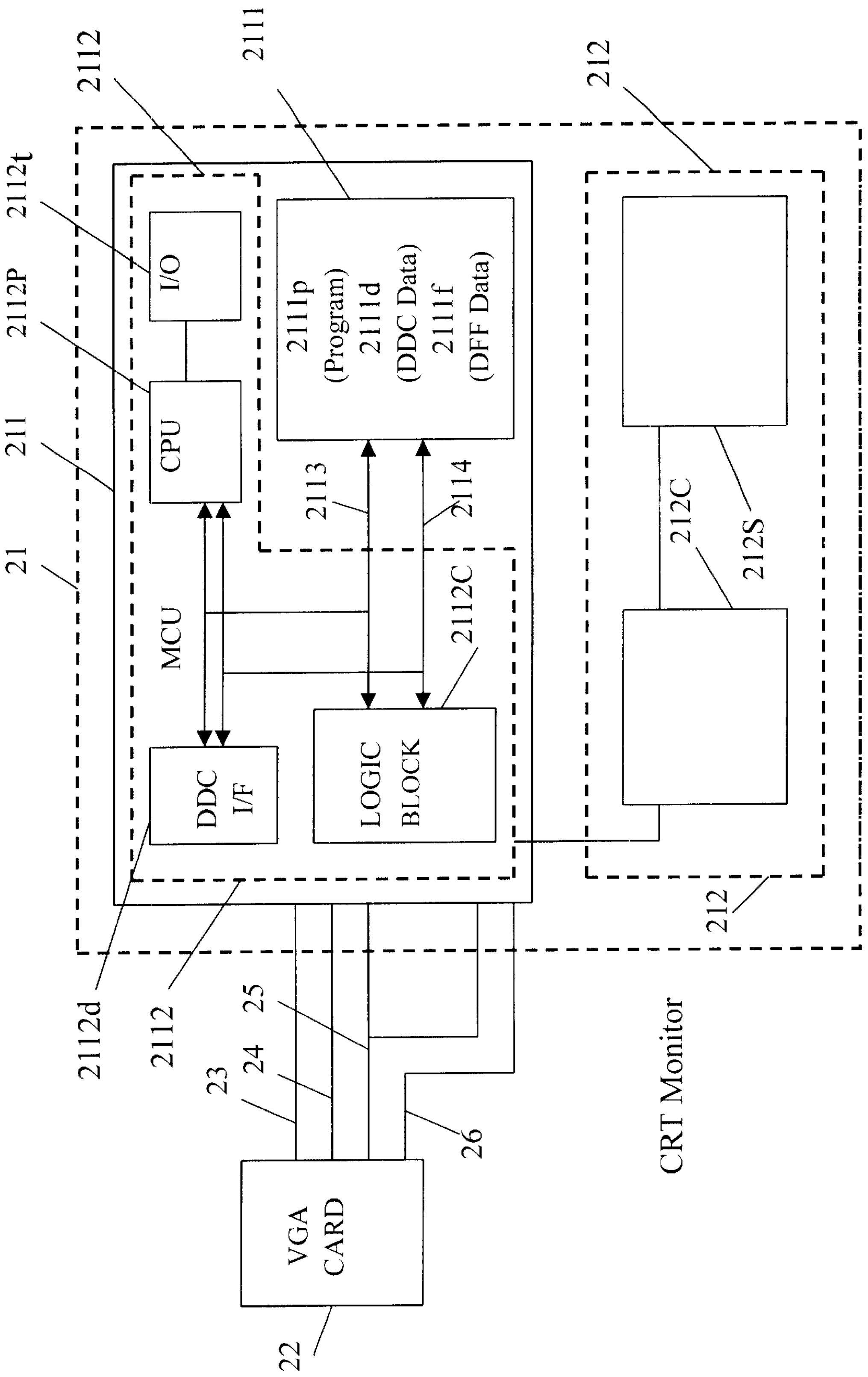
FIG. 2 is a block diagram representing a first preferred embodiment according to the present invention.

In FIG. 2, a single semiconductor chip 211 is suggested by the present invention to communicate with a video signal provider 22 such as a VGA card, for enabling a video display apparatus 212 to display a video signal provided by the video signal provider 22 or a system associated with the video signal provider 22. The single semiconductor chip 211 comprises:

storage means 2111 for storing a program 2111*p*, DDC (display data channel) data 2111*d*, and DFF (display frame frequency) data 2111*f;* operating means 2112 responsive to a data request signal received from the video signal provider 22 for reading the first group of data 2111*d* and sending the read first group of data 2111*d* to the video signal provider 22, and responsive to a data-match signal received from the video signal provider 22 for detecting a data mode of the data-match signal to read, according to the detected data mode, a corresponding part of second group of data from among the second group of data 2111*f*, and directed by the program 2111*p* accessed from the storage means 2111 to adapt the corresponding part of second group of data for being received by the video display apparatus 212 and for enabling the video display apparatus 212 to display the video signal provided by the video signal provider 22.

The first group of data 2111*d* represents the specification of the monitor 21 or the video display apparatus 212. The video signal provider 22 is informed of the specification of monitor 21 or video display apparatus 212 when receiving the first group of data sent from operating means 2112. The corresponding part of second group of data is selected, according to the detected data mode of the data-match signal, from among second group of data 2111*f* to represent a feasible or an optimum operating mode (an operating mode corresponding to the data mode of the data-match signal and the display screen specifications, for example) of the video display apparatus 212 for displaying the video signal provided by the video signal provider 22, thereby the signal characterized or represented by the corresponding part of second group of data and received by video display apparatus 212 can enable video display apparatus 212 to perform adequate functions for displaying the video signal applied thereto.

The semiconductor chip 211 may further comprise a communication channel composed of, for example, a data bus 2113 and an address bus 2114, for the operating means 2112 to read the first group of data 2111*d*, the second group of data 2111*f* from storage means 2111, and to access the program 2111*p* from storage means 2111.

The semiconductor chip 211 may have its operating means 2112 comprising a processing unit 2112P for reading the first group of data in response to the data request signal, and reading the corresponding part of second group of data according to the detected data mode. The processing unit 2112P may be similar to or the same as a conventional CPU (central processing unit) capable of executing the program 2111*p* and operating in accordance with the executed program.

The semiconductor chip 211 may also have its operating means 2112 comprising a first-group-of-data-interface-unit 2112*d* for receiving the data request signal and sending the read first group of data to the video signal provider 22. The first-group-of-data-interface-unit 2112*d* may be such that it is responsive to the data request signal for reading the first group of data and sending the read first group of data to the video signal provider, and may also be such that it is responsive to a data-writing signal received from the video signal provider 22 for writing in the storage means 2111 the first group of data contained in the data-writing signal.

The semiconductor chip 211 may further have its operating means 2112 comprising a logic unit 2112*c* for receiving the data-match signal and detecting the data mode of the data-match signal, and for adapting the corresponding part of second group of data for being received by the video display apparatus 212 so as to enable the video display apparatus 212 to display the video signal. For example, a signal representing or encoding the corresponding part of second group of data is outputted in an adequate type or level, for being received by video display apparatus 212 and for enabling video display apparatus 212 to display the video signal provided by video signal provider 22. For another example, the corresponding part of second group of data may just be converted into a signal capable of being received by video display apparatus 212 and controlling video display apparatus 212 to display the video signal provided by video signal provider 22.

The semiconductor chip 211 may even further have its operating means 2112 comprising an I/O unit 2112*t* for communicating with an external user-machine (not shown) so that the first group of data 2111*d*, the second group of data 2111*f*, and the program 2111*p* are accessible by a user through the external user-machine.

The semiconductor chip 211 obviously may have the adapted corresponding part of second group of data outputted to the video display apparatus 212 through I/O unit 2112*t* or an additional I/O unit depending on whichever is convenient for design and fabrication.

Figure 3:
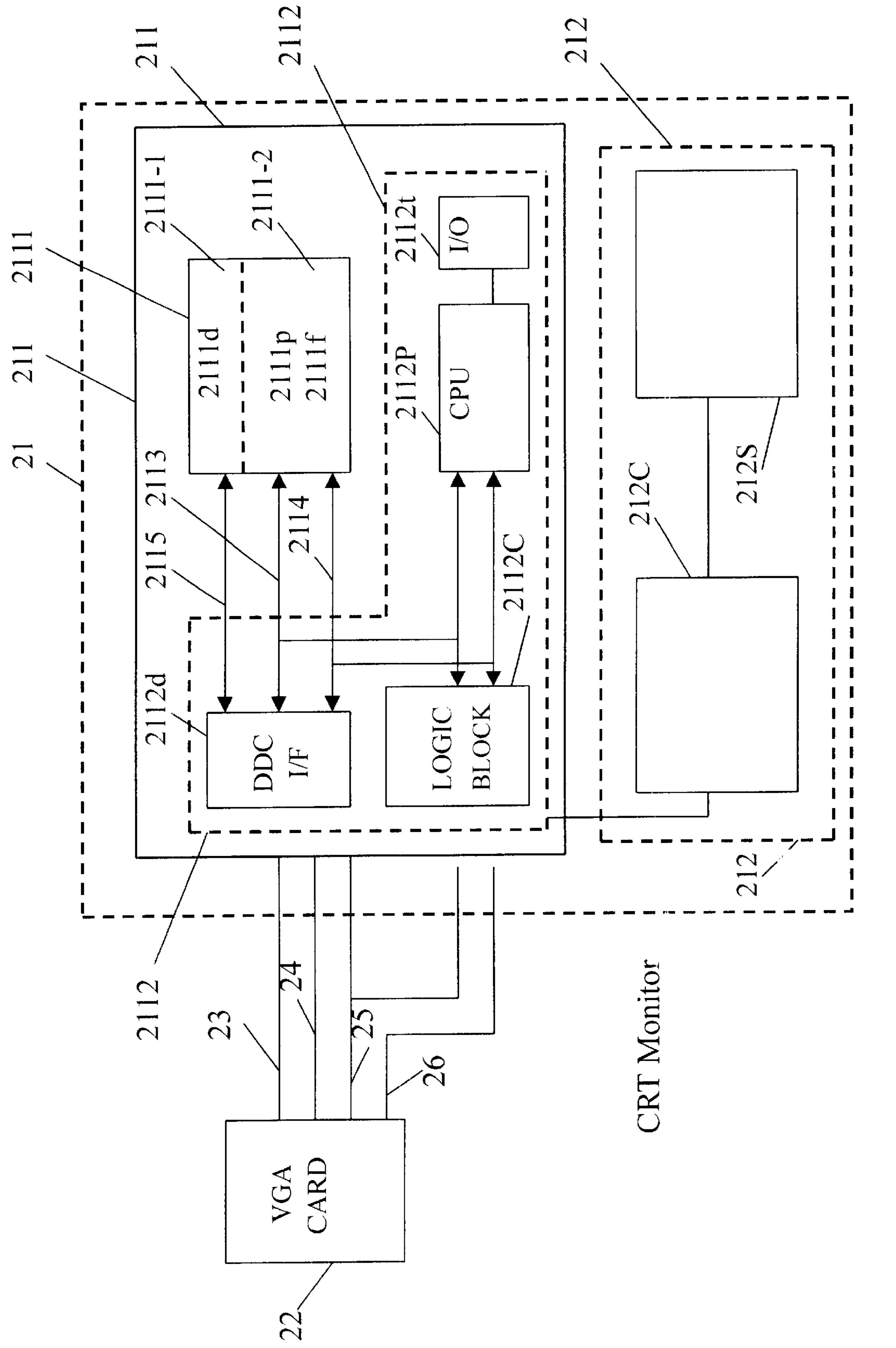
FIG. 3 is a block diagram representing a second preferred embodiment according to the present invention.

The semiconductor chip 211 may also be configured so as to comprise, in addition to the communication channel composed of data bus 2113 and address bus 2114, a DDC-communication-channel 2115 between the first-group-of-data-interface-unit 2112*d* and the storage means 2111, as shown in FIG. 3, for the first-group-of-data-interface-unit 2112*d* to access the first group of data 2111*d*. In FIG. 3, the communication channel composed of data bus 2113 and address bus 2114 may be still for the operating means 2112 to read the first group of data 2111*d*, the second group of data 2111*f*, and to access the program 2111*p*. Here the communication channel composed of data bus 2113 and address bus 2114 may also be only for the operating means 2112 to read the second group of data 2111*f*, and to access the program 2111*p*. It can be understood that the semiconductor chip 211 according to FIG. 3 may be configured so as to have the DDC-communication-channel 2115 therein used by the first-group-of-data-interface-unit 2112*d* to access the first group of data 2111*d* when the communication channel composed of data bus 2113 and address bus 2114 is busy.

Figure 4:
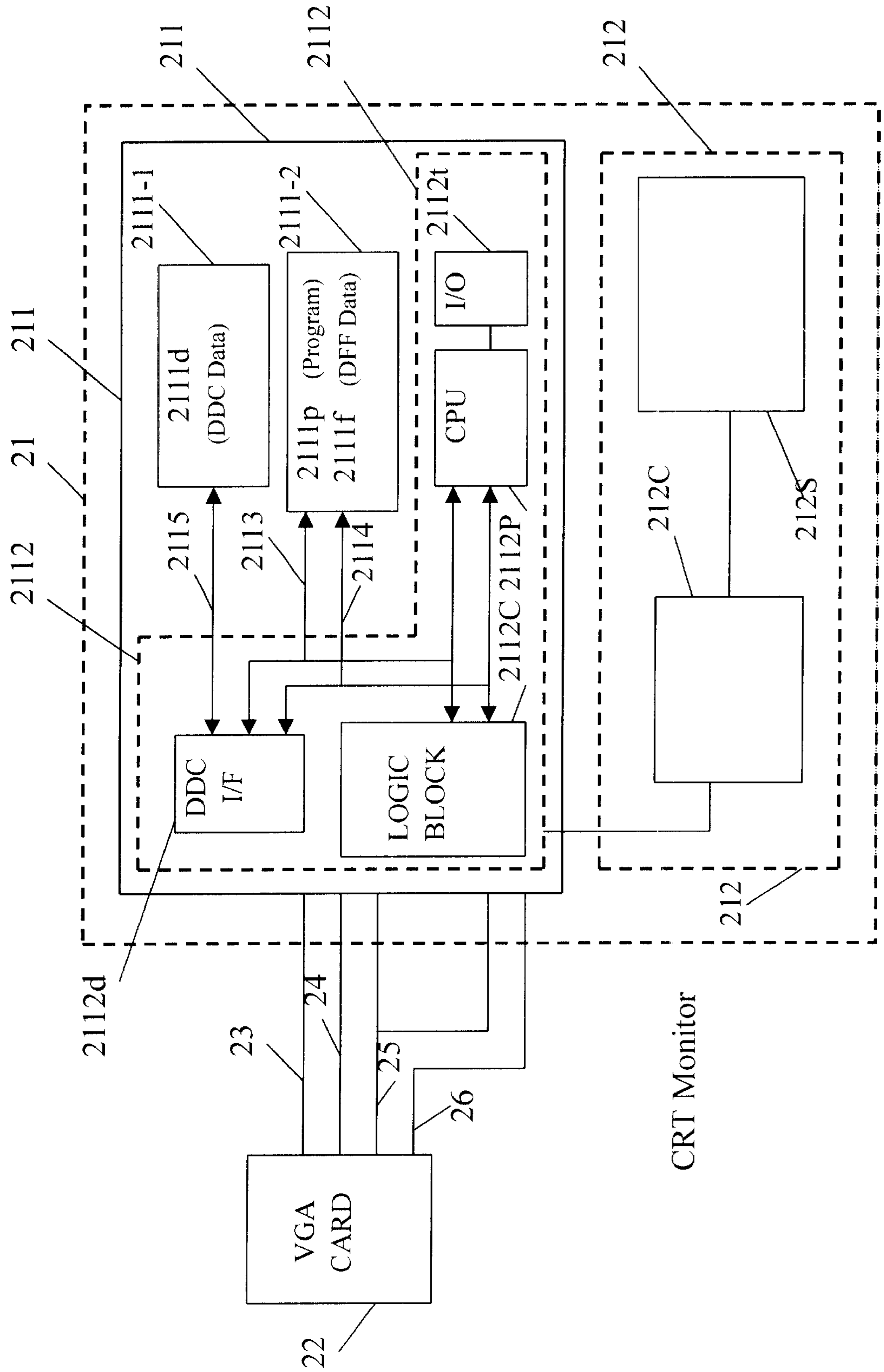
FIG. 4 is a block diagram representing a third preferred embodiment according to the present invention.

The semiconductor chip 211 shown in FIG. 3 may have its storage means 2111 comprising two storage parts 2111-1 and 2111-2, either physically connected together as shown in FIG. 3 or completely independent of each other as shown in FIG. 4. Shown in FIG. 4 are first storage part 2111-1 storing the first group of data 2111*d* accessible by the first-group-of-data-interface-unit 2112*d* through the DDC-communication-channel 2115, and second storage part 2111-2 storing the program 2111*p* and the second group of data 2111*f* both accessible by the operating means 2112 through the communication channel composed of bus 2113 and bus 2114. For example, the program 2111*p* and the second group of data 2111*f* are both accessible by the logic block 2112*c* and/or processing unit 2112P in operating means 2112.

It must be noted that either the communication channel composed of 2113 and 2114, or the DDC-communication-channel 2115, is not limited to a configuration composed of data bus 2113 and address bus 2114. Actually it can be configured in any way as long as program 2111*p*, first group of data 2111*d*, and second group of data 2111 f can be accessed by the operating means 2112; or first group of data 2111*d* is solely accessible by first-group-of-data-interface-unit 2112*d* while program 2111*p* and second group of data 2111*f* are accessible by processing unit 2112P.

The data request signal applied to operating means 2112, specifically to the first-group-of-data-interface-unit 2112*d* of operating means 2112 may be from video signal forwarder 22 or a device affiliated with video signal forwarder 22 or controlled by video signal forwarder 22. The data-match signal received by operating means 2112, specifically by logic block 2112*c* in operating means 2112, is not always sent by video signal forwarder, instead it may be sent by a device affiliated with video signal forwarder 22 or controlled by video signal forwarder 22. The program 2111*p* is executable by processing unit 2112P to direct operating means 2112, specifically to direct the processing unit 2112P and/or logic block 2112*c* in operating means 2112 to adapt the corresponding part of second group of data for being received by the video display apparatus 212, or specifically received by a display control circuit 212C of video display apparatus 212 to enable a display screen 212S of video display apparatus 212 to display the video signal outputted from the video signal forwarder 22 or a device affiliated with video signal forwarder 22 or controlled by video signal forwarder 22. It is also feasible that the program 2111_p_ may be used to direct the processing unit 2112P and/or logic block 2112_c_ to detect the data mode of the data-match signal and to read the corresponding part of second group of data from among the second group of data 2111_f_ for being adapted.

It can be understood that the functions of both logic block 2112_c_ and processing unit 2112P may be performed by a circuit which is here arbitrarily called "logic processing unit" in the disclosure. That is, the processing unit is a circuit comprising a logic block and a processing unit respectively perform the functions of logic block 2112_c_ and processing unit 2112P aforementioned.

The semiconductor chip 211 may also further comprises an I/O unit for communicating with video signal provider/forwarder 22 through the signal channels 23, 24, 25, and 26. Obviously this I/O unit may be integrated together with the I/O unit 2112_t_, or its function may be performed by the I/O unit 2112_t_.

There may also be need of signal channels between logic block 2112_c_, first-group-of-data-interface-unit 2112_d_, processing unit 2112P, and I/O unit in the operating means 2112 of the semiconductor chip 211.

Obviously the semiconductor chip 211 is configured so as to have its storage means 2111 comprising adequate first group of data 2111_d_ and second group of data 2111_f_. For example, among the second group of data 2111_f_, there must be at least the corresponding part of second group of data which corresponds to the detected data mode of the data-match signal if the video signal associated with the detected data mode is to be displayed.

While the invention has been described in terms of what are presently considered to be the most practical and preferred embodiments, it is to be understood that the invention is not be limited to the disclosed embodiment. On the contrary, it is intended to cover various modifications and similar arrangements based on the spirit and scope of the appended claims which are to be accorded with the broadest interpretation so as to encompass all such modifications and similar structures.

What is claimed is:

1. A semiconductor chip communicating with a video signal provider for enabling a video display apparatus to display a video signal provided by said video signal provider, comprising:

storage means for storing a program, a first group of data, and a second group of data; and operating means, responsive to a data request signal received from said video signal provider for reading said first group of data and sending the read first group of data to said video signal provider, and responsive to a data-match signal received from said video signal provider for detecting a data mode of said data-match signal to read, according to the detected data mode, a corresponding part of second group of data from among said second group of data, and directed by the program to adapt said corresponding part of second group of data for being received by said video display apparatus, whereby said video display apparatus is enabled to display the video signal provided by said video signal provider.

2. The semiconductor chip according to claim 1 further comprising a communication channel between said operating means and said storage means for said operating means to read said first group of data, said second group of data, and to access said program.

3. The semiconductor chip according to claim 1 wherein said operating means comprises a processing unit for reading said first group of data in response to said data request signal, and reading said corresponding part of second group of data according to said detected data mode.

4. The semiconductor chip according to claim 1 wherein said operating means comprises a first-group-of-data-interface-unit for receiving said data request signal and sending the read first group of data to said video signal provider.

5. The semiconductor chip according to claim 1 wherein said operating means comprises a logic unit for receiving said data-match signal and detecting the data mode of said data-match signal, and for adapting said corresponding part of second group of data for being received by said video display apparatus so as to enable said video display apparatus to display said video signal.

6. The semiconductor chip according to claim 1 wherein said operating means comprises an I/O unit for communicating with an external user-machine so that said first group of data, said second group of data, and said program are accessible by said external user-machine.

7. The semiconductor chip according to claim 1 wherein said operating means comprises a first-group-of-data-interface-unit responsive to said data request signal for reading said first group of data and sending the read first group of data to said video signal provider.

8. The semiconductor chip according to claim 1 wherein said operating means comprises a first-group-of-data-interface-unit responsive to said data request signal for reading said first group of data and sending the read first group of data to said video signal provider, and responsive to a data-writing signal received from said video signal provider for writing in said storage means the first group of data contained in said data-writing signal.

9. The semiconductor chip according to claim 1 wherein said operating means comprises an I/O unit for outputting the adapted corresponding part of second group of data to said video display apparatus.

10. The semiconductor chip according to claim 2 wherein said communication channel comprises a data bus and an address bus.

11. The semiconductor chip according to claim 4 further comprising: a communication channel between said operating means and said storage means for said operating means to read said first group of data, said second group of data, and to access said program; and a DDC-communication-channel between said first-group-of-data-interface-unit and said storage means for said first-group-of-data-interface-unit to access said first group of data.

12. The semiconductor chip according to claim 4 further comprising: a communication channel between said operating means and said storage means for said operating means to read said first group of data, said second group of data, and to access said program; and a DDC-communication-channel between said first-group-of-data-interface-unit and said storage means for said first-group-of-data-interface-unit to access said first group of data when said communication channel is busy.

13. The semiconductor chip according to claim 4 further comprising: a communication channel between said operating means and said storage means for said operating means to read said second group of data, and to access said program; and a DDC-communication-channel between said first-group-of-data-interface-unit and said storage means for said first-group-of-data-interface-unit to access said first group of data.

14. The semiconductor chip according to claim 13 wherein said storage means comprises a first storage part storing said first group of data accessible by said first-group-of-data-interface-unit through said DDC-communication-channel, and a second storage part storing said program and said second group of data both accessible by said operating means through said communication channel.

15. A semiconductor chip communicating with a video signal forwarder for enabling a video display apparatus to display a video signal outputted from said video signal forwarder, comprising:

operating means; and storage means for storing a program, a first group of data, and a second group of data, all accessible by said operating means;

said operating means responsive to a data request signal applied thereto for forwarding said first group of data from said storage means to said video signal forwarder, and responsive to a data-match signal received from said video signal forwarder for detecting a data mode of said data-match signal to read, according to the detected data mode, a corresponding part of second group of data from among said second group of data, and directed by said program to adapt said corresponding part of second group of data for being received by said video display apparatus to enable said video display apparatus to display the video signal outputted from said video signal forwarder.

16. A semiconductor chip communicating with a video signal forwarder for enabling a video display apparatus to display a video signal outputted from said video signal forwarder, comprising:

a first-group-of-data-interface-unit;

a logic processing unit;

first storage means for storing a first group of data accessible by said first-group-of-data-interface-unit;

second storage means for storing a program and a second group of data, all accessible by said logic processing means;

said first-group-of-data-interface-unit responsive to a data request signal applied thereto for reading said first group of data and sending the read first group of data to said video signal forwarder, said logic processing unit responsive to a data-match signal received from said video signal forwarder for detecting a data mode of said data-match signal to read, according to the detected data mode, a corresponding part of second group of data from among said second group of data, and directed by said program to adapt said corresponding part of second group of data for being received by said video display apparatus to enable said video display apparatus to display the video signal outputted from said video signal forwarder.

17. The semiconductor chip according to claim 16 wherein said logic processing unit comprises a logic block and a processing unit, said logic block to receive said data-match signal and detect said data mode for said processing unit to read, according to said detected data mode, a corresponding part of second group of data from among said second group of data, for said logic block to adapt said corresponding part of second group of data for being received by said video display apparatus to enable said video display apparatus to display the video signal outputted from said video signal forwarder.

18. The semiconductor chip according to claim 16 wherein said second group of data comprises at least said corresponding part of second group of data corresponding to said detected data mode.

19. The semiconductor chip according to claim 16 wherein said corresponding part of second group of data is adapted for being received by a video display control circuit in said video display apparatus to enable said video display apparatus to display said video signal.

20. The semiconductor chip according to claim 16 wherein said data request signal is provided by said video signal forwarder.

* * * * *